(12) United States Patent
Gery

(10) Patent No.: US 6,879,127 B2
(45) Date of Patent: Apr. 12, 2005

(54) 3-RING MAGNETIC ANTI-GRAVITY SUPPORT

(75) Inventor: Jean-Marc Gery, West Hollywood, CA (US)

(73) Assignee: Nikon Corporation, Tokyo (JP)

( * ) Notice: Subject to any disclaimer, the term of this patent is extended or adjusted under 35 U.S.C. 154(b) by 260 days.

(21) Appl. No.: 10/074,810

(22) Filed: Feb. 12, 2002

(65) Prior Publication Data
US 2003/0151321 A1 Aug. 14, 2003

(51) Int. Cl.$^7$ .................................................. B66C 1/04
(52) U.S. Cl. ...................................... 318/649; 335/285
(58) Field of Search ........................ 318/649; 335/285, 335/288, 289; 269/8

(56) References Cited

U.S. PATENT DOCUMENTS

| | | | | |
|---|---|---|---|---|
| 4,555,650 A | * | 11/1985 | Asakawa ..................... 318/135 |
| 4,654,571 A | * | 3/1987 | Hinds .......................... 318/687 |
| 4,952,858 A | | 8/1990 | Galburt ....................... 318/647 |
| 5,528,118 A | | 6/1996 | Lee | |
| 5,623,853 A | | 4/1997 | Novak et al. | |
| 5,631,617 A | * | 5/1997 | Morishita ..................... 335/216 |
| 5,668,672 A | | 9/1997 | Oomura | |
| 5,689,377 A | | 11/1997 | Takahashi | |
| 5,780,943 A | | 7/1998 | Ono ............................. 310/12 |
| 5,835,275 A | | 11/1998 | Takahashi et al. | |
| 5,874,820 A | | 2/1999 | Lee | |
| 6,040,675 A | | 3/2000 | Ono ............................. 318/649 |
| 6,069,417 A | * | 5/2000 | Yuan et al. .................... 310/12 |
| 6,118,200 A | * | 9/2000 | Fremerey et al. ............ 310/90.5 |
| 6,597,433 B1 | * | 7/2003 | Renkens et al. ............... 355/75 |

FOREIGN PATENT DOCUMENTS

JP 08-166475 6/1996
JP 08/330224 12/1996

* cited by examiner

Primary Examiner—Bentsu Ro
(74) Attorney, Agent, or Firm—Beyer Weaver & Thomas LLP (57) ABSTRACT

An apparatus for providing support between a first structure and a second structure is described. The apparatus includes a first section and a second section. The first section has a first group of at least one magnetic frame member, and is coupled to the first structure. The second section has a second group of at least one magnetic frame member, and is coupled to the second structure. The first and second sections present magnetic force therebetween.

28 Claims, 7 Drawing Sheets

3-RING MAGNETIC ANTI-GRAVITY SUPPORT

BACKGROUND OF THE INVENTION

The invention relates to a supporting mount, and specifically to methods and apparatus for supporting between a wafer table and a wafer stage used for semiconductor process.

Shock-absorbing mounts are widely used in a variety of applications. Above all, an optical apparatus used for semiconductor process requires high precision of imaging onto a target device. Springs have been used for damping of vibration transmitted from a wafer stage to a wafer table used for semiconductor manufacturing.

Current integrated circuit (IC) manufacturing practices use lithography photomasks (reticles) to apply various patterns to a photosensitized semiconductor wafer used to create the ICs. Reticles are typically high-precision plates that contain a pattern of extremely small images of the various components of an electronic circuit. A reticle is used as a master to transfer a plurality of the circuit pattern onto a photosensitized wafer. Current state-of-the-art lithographic system often must position an ultra-fine image to within 15 nanometers. Current circuit architectures often have conductor linewidths as narrow as 30 nanometers. Accordingly, lithography processing equipment requires advanced precision optical and mechanical systems and even higher precision systems will be required in the future, as still smaller images become common.

Lithographic exposure apparatuses are used to project images from the reticle onto the photosensitized wafer during semiconductor processing. A typical exposure apparatus includes a base frame having a lower enclosure that contains a wafer stage for holding a semiconductor wafer workpiece. The base frame also supports an optical device that holds a reticle stage and is arranged to project the images from a reticle carried by the reticle stage onto the wafer workpiece. The base frame typically supports the optical device through a vibration isolation system designed to damp and isolate vibrations between components of exposure apparatus so that vibrations in one component are not transmitted to the other.

This is deemed necessary because mechanical vibrations transmitted between components can adversely influence the accuracy of exposure apparatus. A potential problem with providing a spring between the wafer table and the wafer stage is that many if not most spring damper mechanisms provide high stiffness. In other words, the conventional damper mechanisms tend not to move flexibly (i.e., without stiffness) when the wafer stage is vibrated.

As such, it becomes increasingly necessary to devise a system that provides low stiffness between the wafer table and the wafer stage, thus avoiding transmission of vibration from the wafer stage to the wafer table.

SUMMARY OF THE INVENTION

Various anti-gravity mounts according to the embodiments of the present invention include at least one inner magnet and at least one outer magnet, thereby presenting low stiffness. Some embodiments have at least two inner magnets and at least two outer magnets, thereby generating smooth stiffness along the vertical axis. Thus, the embodiments of the present invention are capable of providing low overall stiffness, and thus, reducing vibration transmitted from the wafer stage to the wafer table.

In another specific embodiment, a pitch of the outer magnetic frame members is less than a pitch of the inner magnetic frame members, and a pitch of the center magnetic core members is less than a pitch of the inner magnetic frame members.

In still another specific embodiment, a ratio of the pitch of the inner magnetic frame members to the pitch of the outer magnetic frame members ranges from about 1.0 to about 1.5, and a ratio of the pitch of the inner magnetic frame members to the pitch of the center magnetic core members ranges from about 1.0 to about 1.5.

A further understanding of the nature and advantages of the present invention may be realized by reference to the remaining portions of the specification and the drawings.

BRIEF DESCRIPTION OF THE DRAWING

The invention, together with further objects and advantages thereof, may best be understood by reference to the following description taken in conjunction with the accompanying drawings in which.

DETAILED DESCRIPTION OF SPECIFIC EMBODIMENTS

Embodiments of the present invention will now be described in detail with reference to the drawings, wherein like elements are referred to with like reference labels throughout.

Figure 4:
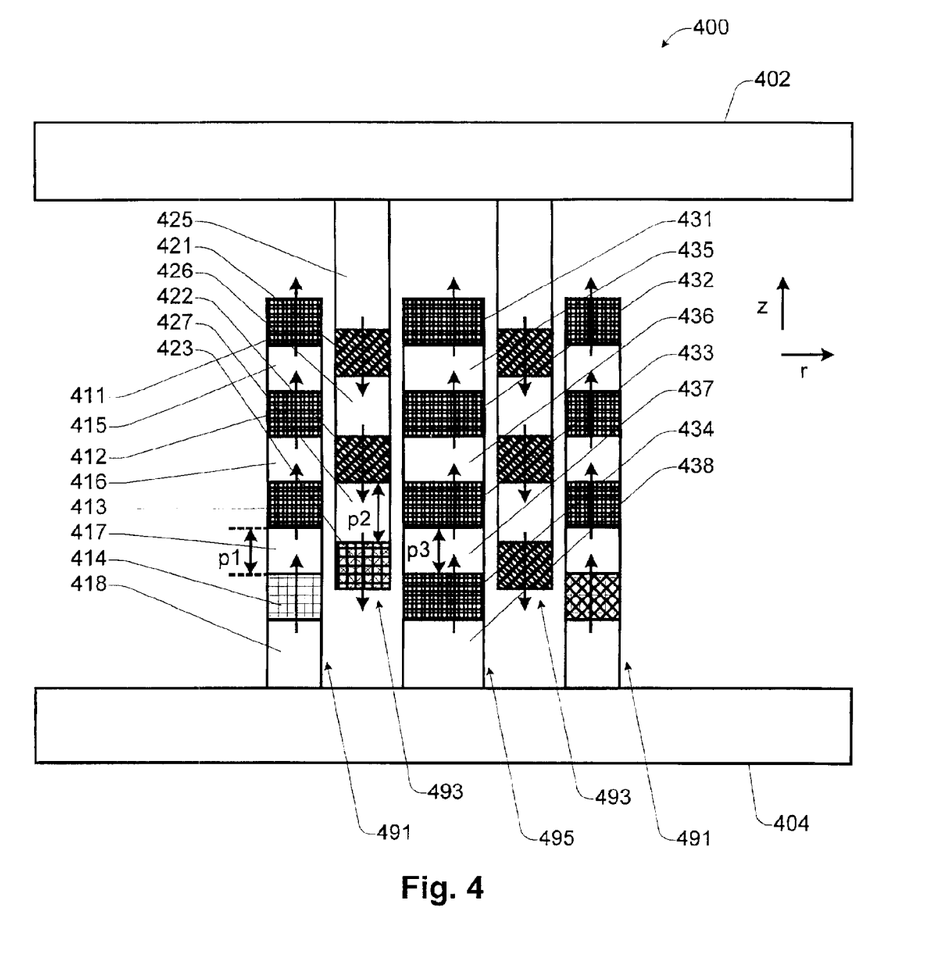
FIG. 4 is a cross-sectional view of an anti-gravity mount according to a specific embodiment of the present invention.
Figure 5:
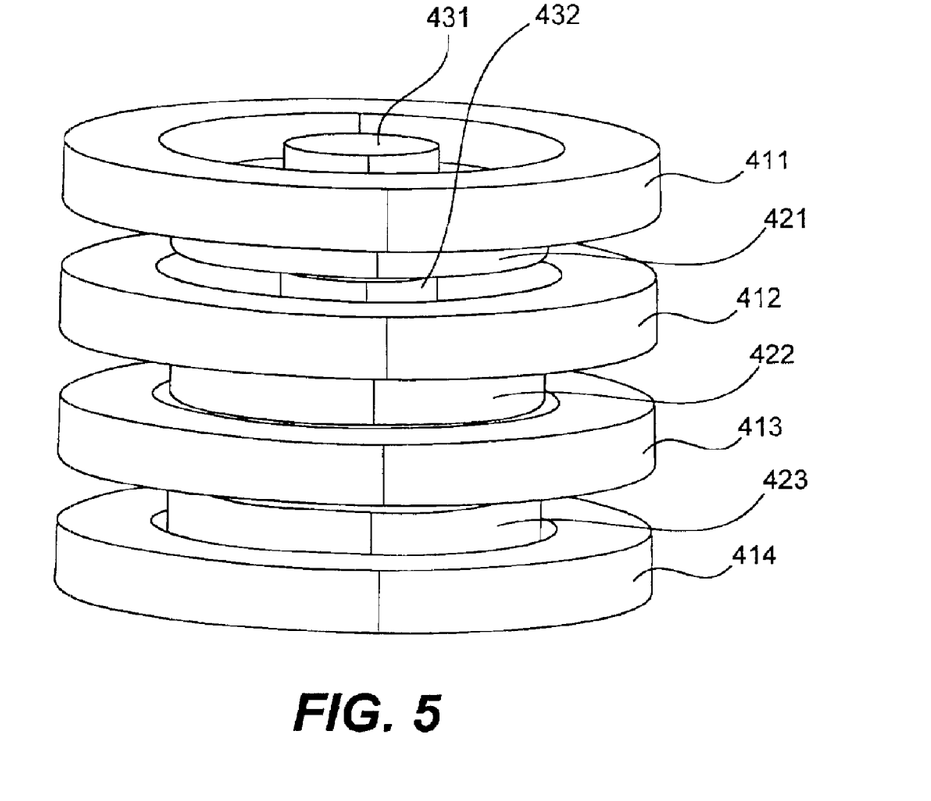
FIG. 5 is a perspective view of the anti-gravity mount of the present invention.
Figure 6:
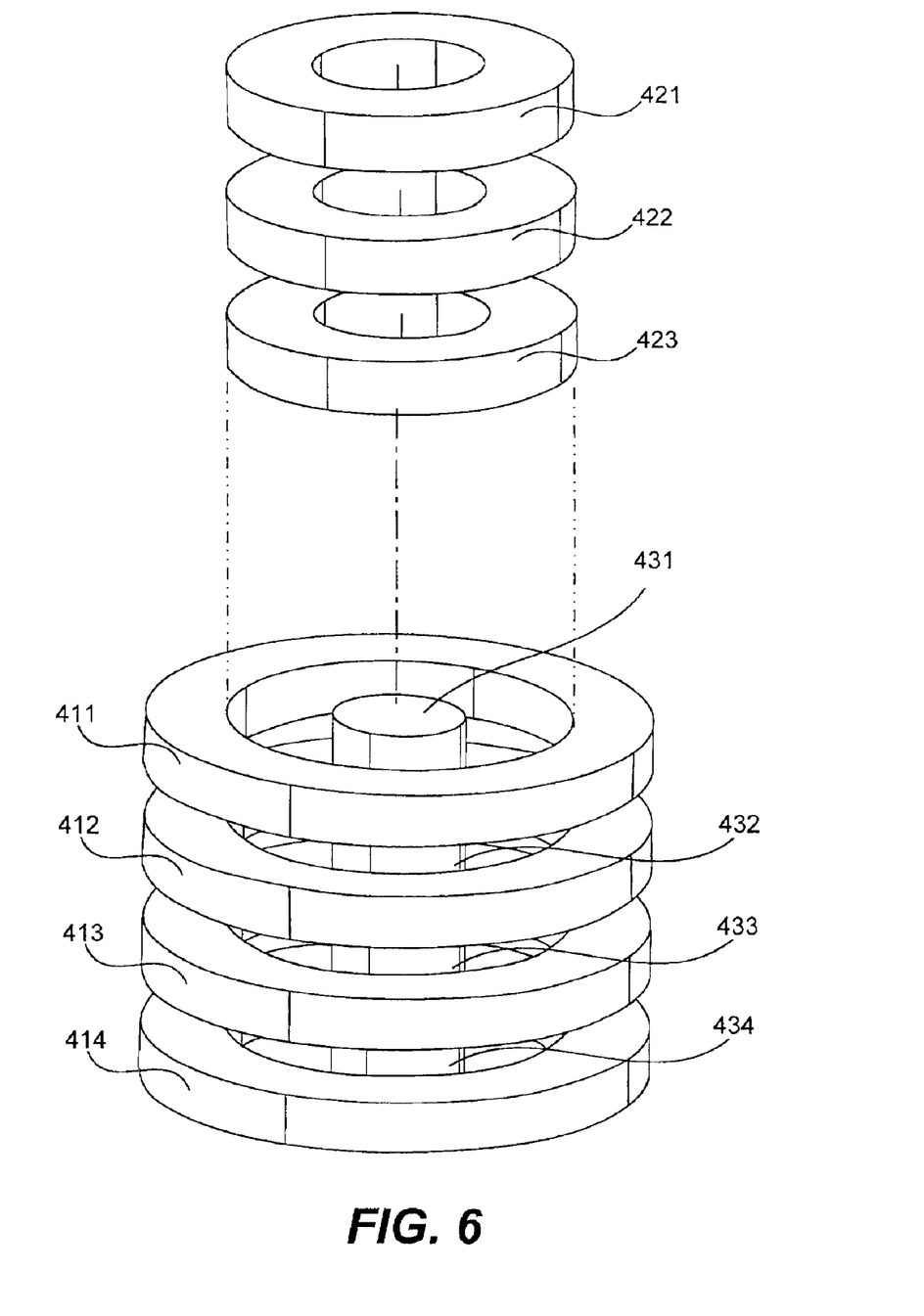
FIGS. 6 and 7 are perspective exploded views of parts of the anti-gravity mount of the present invention.
Figure 7:
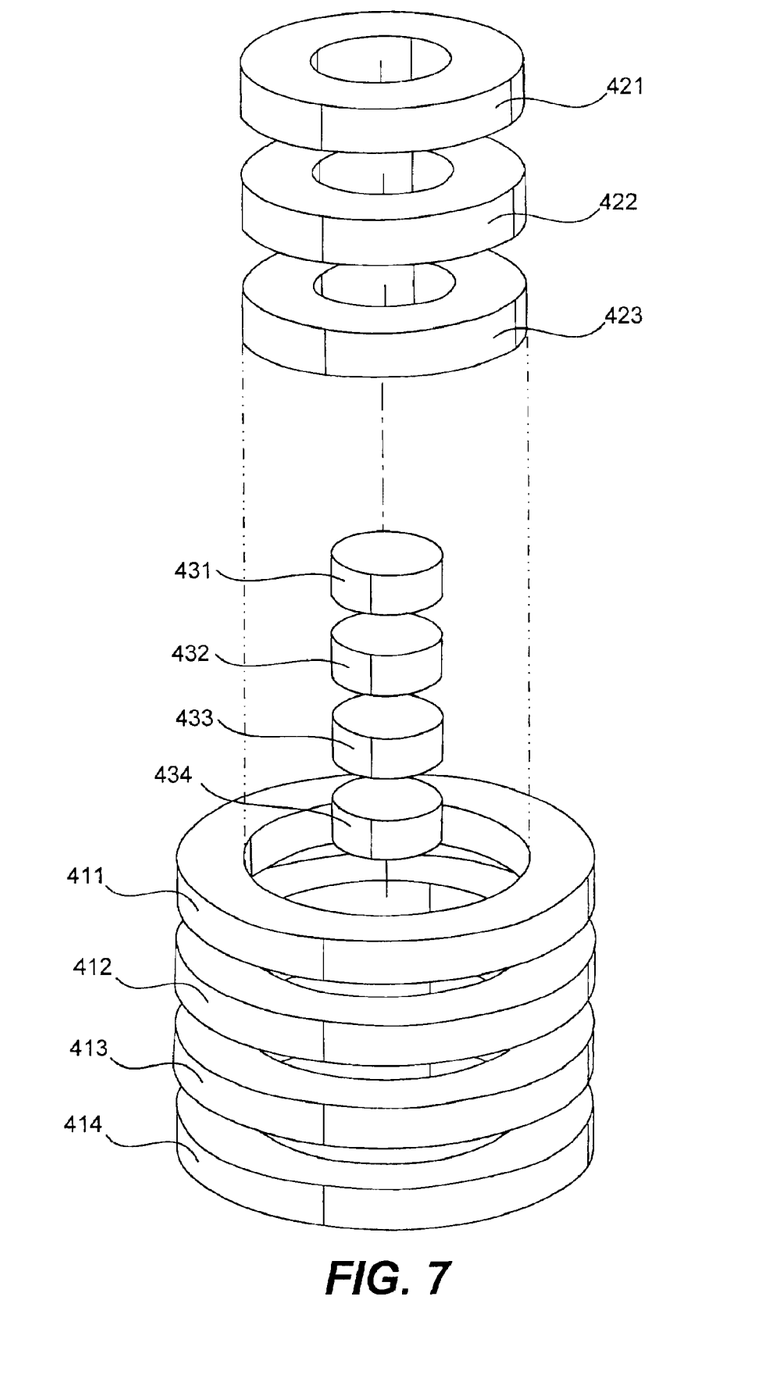

FIG. 4 is a cross-sectional view of an anti-gravity mount 400 according to a specific embodiment of the present invention. FIG. 5 is a perspective view of the anti-gravity mount 400. FIGS. 6 and 7 are perspective exploded views of parts of the anti-gravity mount 400.

The anti-gravity mount 400 provides support between a wafer table 402 and a wafer stage 404 used for a lithographic exposure apparatus which will be described later referring to FIG. 1. In FIG. 4, arrows "z" and "r" indicate vertical and lateral directions, respectively.

An outer ring section 491 includes magnetic rings 411–414. An inner ring section 493 includes magnetic rings 421–423. A center core section 495 includes magnetic cores 431–434. Each of the magnetic rings 411–414 and 421–423 has a shape of a cylindrical shell. Each of the magnetic cores 431–434 has a shape of a cylindrical core. The magnetic rings 411–414 are coupled with the wafer stage 404 by support members 415–418. The magnetic rings 421–423 are coupled with the wafer table 402 by support members 425–427. The magnetic cores 431–434 are coupled with the wafer stage 404 by support members 435–438. In FIGS.

5–7, the support members 415–418, 425–427, and 435–438 are omitted for the sake of simplicity.

The magnetic rings 411–414, the magnetic rings 421–423, and the magnetic cores 431–434 are made from, for example, made from one of retentive hard magnetic materials, which are characterized by a high-energy product, making them suitable for permanent magnets. These materials have high remanences and coercive forces, and include martensitic lattice-transformation alloys (quench- and work-hardened alloys), precipitation-hardened alloys, ordered alloys, fine-particle magnets, and the like. In this specific embodiment illustrated in FIGS. 4–7, the magnetic rings 411–414, the magnetic rings 421–423, and the magnetic cores 431–434 are made from a permanent magnet material, e.g., NdFeB. The support members 415–418, 425–427, and 435–438 are made from non-magnetic materials such as plastic materials, resin, and the like.

In this specific embodiment of the present invention, each of the magnetic rings 411–414 and 421–423 is in a ring shape. However, the magnetic rings 411–414 and 421–423 may be made in a different shape as "magnetic frame members" as long as they have suitable magnetic characteristics. Thus, various suitable shapes for the magnetic rings 411–414 and 421–423 may be utilized in other embodiments of the invention.

In the various embodiments of the present invention, thus, the outer ring section 491 and the inner ring section 493 present magnetic force therebetween, and the inner ring section 493 and the center core section 495 present magnetic force therebetween. By stacking a plurality of magnetic rings, the anti-gravity mount 400 presents overall low stiffness which generates flat and smooth responses when the mount 400 is moved along the vertical and lateral directions.

In this specification, arrows indicated near the magnetic rings or cores, which are permanent magnets, represent a direction of magnetic poles (from S to N). In this specific embodiment, the outer ring section 491 and the center core section 495 have the same magnetic pole direction and the inner ring section 493 has the opposite magnetic pole direction as shown in FIG. 4. Stiffness is reduced because the effective air gap change is fairly small with respect to the air gap as the system moves.

In the above-described embodiment, the magnetic rings 421–423 are provided within the magnetic rings 411–414, and the magnetic cores 431–434 are provided within the magnetic rings 421–423. In this specification, a magnetic ring or core (e.g., 421) is provided "within" a magnetic ring (e.g., 411) as long as the magnetic ring (e.g., 421) is located within an infinite cylindrical surface defined by the inner surface of the magnetic ring (e.g., 411). Thus, for example, even when the bottom edge of the magnetic ring 421 is located below the bottom edge of the magnetic ring 411 in FIG. 4, the magnetic ring 421 is "within" the magnetic ring 411.

In various embodiments of the present invention, each of the outer ring section 491, the inner ring section 493 and the center core section 495 has at least one magnetic ring made from one of retentive hard magnetic materials as described above. In this specific embodiment, the outer ring section 491 and the center core section 495 include four magnetic rings and four magnetic cores, respectively, and the inner ring section 493 includes three magnetic rings. Thus, a difference between the number of the magnetic rings in the outer ring section 491 and the number of the magnetic rings in the inner ring section 493 is one. The number of the magnetic rings in the outer ring section 491 is the same as the number of the magnetic cores in the center core section 495. However, it should be appreciated that the numbers of the outer ring section 491, the inner ring section 493, and the center core section 495 may be other numbers, which are at least one. In some embodiments, the center core section 495 can be omitted.

The magnetic rings 411–414, 421–423, and the magnetic cores 431–434 are equally spaced by pitches p1, p2, and p3, respectively, as shown in FIG. 4. Various embodiments of the present invention satisfy the following equations:

$$p1 < p2,$$

$$p3 < p2, \text{and}$$

$$p1 = p3.$$

The specific embodiment shown in FIG. 4 satisfies the following equations:

$$1.0 < p2/p1 < 1.5, \text{ and}$$

$$1.0 < p2/p3 < 1.5.$$

Through experiments, the above equations of the pitches p1, p2 and p3 have been found to be beneficial. Experimental results have shown that the above relationships of pitches equalize the overall stiffness generated by interaction between the outer ring section 491 and the inner ring section 493, and between the inner ring section 493 and the center core section 495 when the inner ring section 493 having the magnetic rings 421–423 moves along the z direction. Thus, according to the various embodiments of the present invention, the overall stiffness along the z direction can be reduced. For example, a set of the magnetic rings 413 and 422, and the magnetic core 433 presents the most dominant magnetic repulsive force to support the wafer table 402 in FIG. 4. If the wafer table 402 moves down in a reverse direction of the z direction, a set of the magnetic rings 412 and 421, and the magnetic core 432 presents the most dominant magnetic repulsive force to support the wafer table 402. Conversely, if the wafer table 402 moves up in the z direction, a set of the magnetic rings 414 and 423, and the magnetic core 434 presents the most dominant magnetic repulsive force to support the wafer table 402. Consequently, the embodiments of the anti-gravity mount according to the present invention presents smooth stiffness characteristics with respect to the z direction, thereby enhancing shock absorbing effect to reduce vibration transmitted from the wafer stage 404.

The placement of the inner ring section 493 within the outer ring section 491 and the center core section 495 with the inner ring section 493 allows the wafer table 402 to be suspended above the wafer stage 404 by a magnetic repulsive force. This may also allows the provision of a low stiffness in the r direction between the wafer table 402 and wafer stage 404.

In this specific embodiment, the pitches p1 and p3 satisfy the above relationship p1=p3. However, it should be appreciated that the pitches p1 and p3 do not have to satisfy the relationship p1=p3 as long as p1<p2 and p3<p2. More preferably, $$1.0 < p2/p1 < 1.5, \text{ and}$$

$$1.0 < p2/p3 < 1.5.$$

By symmetry, some embodiments of the present invention satisfy the following equations:

$p1 > p2$, $p3 > p2$, $1.0 < p1/p2 < 1.5$, and $1.0 < p3/p2 < 1.5$.

In a specific embodiment satisfying the above equations, the pitches p1 and p3 satisfy an equation p1=p3.

By generalizing the above relationships of the pitches p1, p2 and p3, various embodiments of the present invention may satisfy the following equations:

$2/3 < p2/p1 < 1.5$ $(p2/p1 \neq 1)$, and $2/3 < p2/p3 < 1.5$ $(p2/p3 \neq 1)$.

In the above embodiment, the magnetic rings 411–414, 421–423, and the magnetic cores 431–434 have circular cross-sections when cut by a plane perpendicular to the z direction. However, the magnetic rings 411–414, 421–423, and the magnetic cores 431–434 may have non-circular cross-sections, such as oval, hexagonal, or square cross-sections. Therefore, frame shaped magnetic members may be used for the outer and inner sections 491 and 493 instead of the magnetic rings.

In the above-described embodiment, the inner ring section 493 is coupled with the wafer table 402, and the outer ring section 491 and the center core section 495 are coupled with the wafer stage 404. Conversely, however, the inner ring section 493 may be coupled with the wafer stage 404, and the outer ring section 491 and the center core section 495 may be coupled with the wafer table 402.

Figure 1:
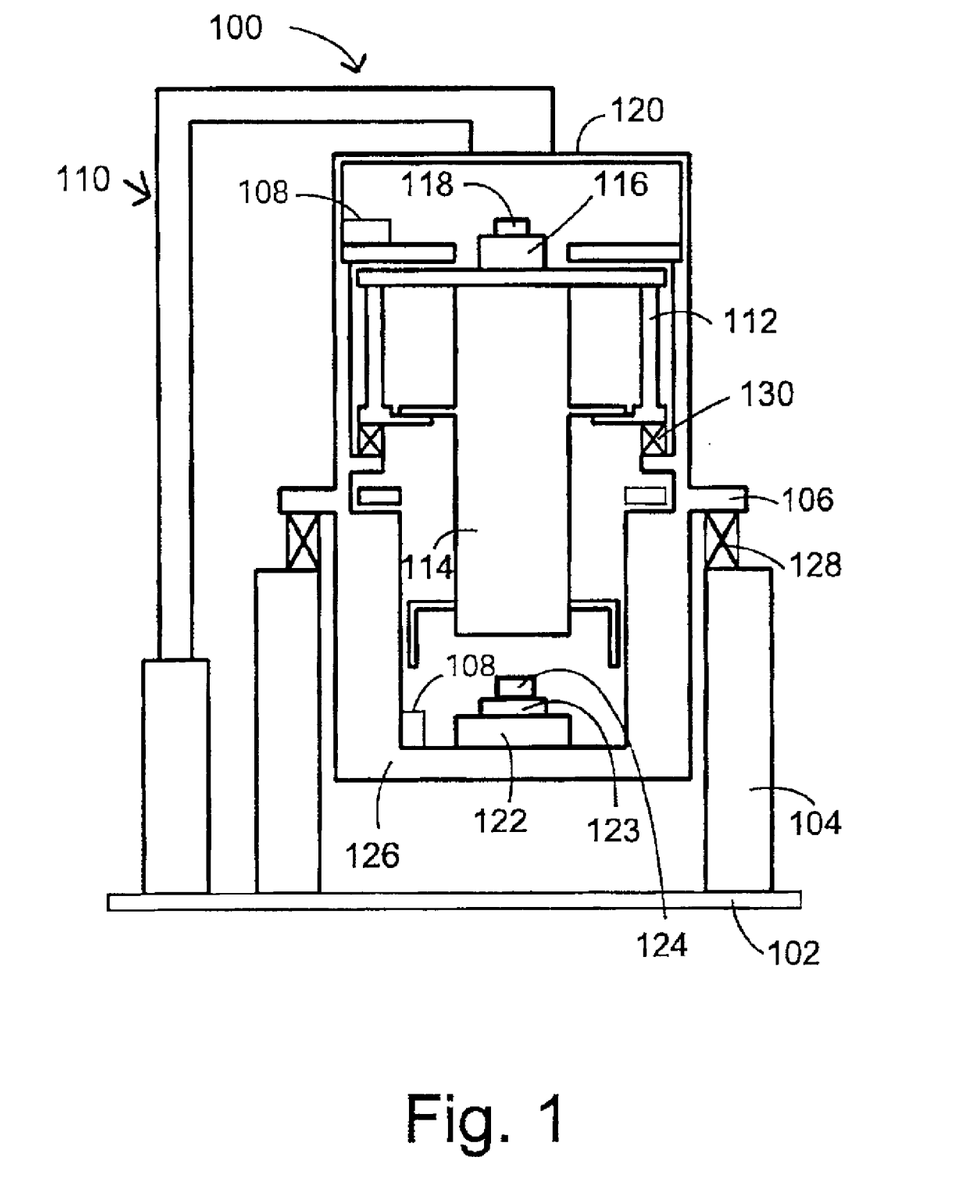
FIG. 1 is a cross-sectional view of an exemplary lithographic exposure apparatus that incorporates the present invention.

Referring next to FIG. 1, one exemplary lithographic exposure that incorporates the present invention will be briefly described. A typical exposure apparatus 100 includes a mounting base 102, a support frame 104, a base frame 106, a measurement system 108, a control system (not shown), an illumination system 110, an optical frame 112, an optical device 114, a reticle stage 116 for retaining a reticle 118, an upper enclosure 120 surrounding reticle stage 116, a wafer stage 122, a wafer table 123 for retaining a semiconductor wafer workpiece 124, and a lower enclosure 126 surrounding wafer stage 122.

The support frame 104 typically supports base frame 106 above mounting base 102 through a base vibration isolation system 128. Base frame 106 in turn supports, through an optical vibration isolation system 130, optical frame 112, measurement system 108, reticle stage 116, upper enclosure 120, optical device 114, wafer stage 122, wafer table 123 and lower enclosure 126 above base frame 106. Optical frame 112 in turn supports optical devise 114 and reticle stage 116 above base frame 106 through optical vibration isolation system 130. As a result thereof, optical frame 112 and its supported components and base frame 106 are effectively attached in series through base vibration isolation system 128 and optical vibration isolation system 130 to mounting base 102. Vibration isolation systems 128 and 130 are designed to damp and isolate vibrations between components of exposure apparatus 100. Measurement system 108 monitors the positions of stages 116 and 122 relative to a reference such as optical device 114 and outputs position data to the control system. Optical device 114 typically includes a lens assembly that projects and/or focuses the light or beam from an illumination system 110 that passes through reticle 118. Reticle stage 116 is attached to one or more movers (not shown) directed by the control system to precisely position reticle 118 relative to optical device 114. Similarly, wafer stage 122 includes one or more movers (not shown) to precisely position the wafer workpiece 124 with wafer table 123 relative to optical device (lens assembly) 114.

Wafer table 123 moves relative to wafer stage 122 by the mover (for example, electromagnetic actuator utilizing Lorentz type force) for leveling and focusing motions of wafer workpiece 124. The actuator may include a plurality of actuators disposed between wafer stage 122 and wafer table 123 so that wafer table 123 can move relative to wafer stage 122 in six degrees of freedom (X, Y, Z, θx, θy, θz). The wafer stage 122 and the wafer table 123 may have a shielding member that shields magnetic fields generated by the magnetic materials of the anti-gravity mount 400 so that the magnetic fields do not adversely affect the devices mounted around the wafer stage 122 and the wafer table 123. Further, air bellows may be utilized to support wafer table 123 relative to wafer stage 122 in addition to the anti-gravity mount 400 of this invention. This embodiment of the present invention may be utilized for reticle stage 116 in addition to wafer stage 122 by providing a reticle table that retains reticle 118 and moves relative to stage 116.

As will be appreciated by those skilled in the art, there are a number of different types of photolithographic devices. For example, exposure apparatus 100 can be used as a scanning type photolithography system which exposes the pattern from reticle 118 onto wafer 124 with reticle 118 and wafer 124 moving synchronously. In a scanning type lithographic device, reticle 118 is moved perpendicular to an optical axis of optical device 114 by reticle stage 116 and wafer 124 is moved perpendicular to an optical axis of optical device 114 by wafer stage 122. Scanning of reticle 118 and wafer 124 occurs while reticle 118 and wafer 124 are moving synchronously.

Alternately, exposure apparatus 100 can be a step-and-repeat type photolithography system that exposes reticle 118 while reticle 118 and wafer 124 are stationary. In the step and repeat process, wafer 124 is in a constant position relative to reticle 118 and optical device 114 during the exposure of an individual field. Subsequently, between consecutive exposure steps, wafer 124 is consecutively moved by wafer stage 122 perpendicular to the optical axis of optical device 114 so that the next field of semiconductor wafer 124 is brought into position relative to optical device 114 and reticle 118 for exposure. Following this process, the images on reticle 118 are sequentially exposed onto the fields of wafer 124 so that the next field of semiconductor wafer 124 is brought into position relative to optical device 114 and reticle 118.

However, the use of exposure apparatus 100 provided herein is not limited to a photolithography system for a semiconductor manufacturing. Exposure apparatus 100, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Additionally, the present invention provided herein can be used in other devices, including other semiconductor processing equipment, machine tools, metal cutting machines, and inspection machines. The present invention is desirable in machines where it is desirable to prevent the transmission of vibrations.

The illumination source (of illumination system 110) can be g-line (436 nm), i-line (365 nm), KrF excimer laser (248 nm), ArF excimer laser (193 nm) and $F_2$ laser (157 nm). Alternatively, the illumination source can also use charged particle beams such as x-ray and electron beam. For instance, in the case where an electron beam is used, thermionic emission type lanthanum hexaboride ($LaB_6$,) or tantalum (Ta) can be used as an electron gun. Furthermore, in the case where an electron beam is used, the structure could be such that either a mask is used or a pattern can be directly formed on a substrate without the use of a mask.

With respect to optical device 114, when far ultra-violet rays such as the excimer laser is used, glass materials such as quartz and fluorite that transmit far ultra-violet rays is preferably used. When the $F_2$ type laser or x-ray is used, optical device 114 should preferably be either catadioptric or refractive (a reticle should also preferably be a reflective type), and when an electron beam is used, electron optics should preferably comprise electron lenses and deflectors. The optical path for the electron beams should be in a vacuum.

Also, with an exposure device that employs vacuum ultra-violet radiation (VUV) of wavelength 200 nm or lower, use of the catadioptric type optical system can be considered. Examples of the catadioptric type of optical system include the disclosure Japan Patent Application Disclosure No. 8-171054 published in the Official Gazette for Laid-Open Patent Applications and its counterpart U.S. Pat. No. 5,668,672, as well as Japan Patent Application Disclosure No. 10-20195 and its counterpart U.S. Pat. No. 5,835,275. In these cases, the reflecting optical device can be a catadioptric optical system incorporating a beam splitter and concave mirror. Japan Patent Application Disclosure No. 8-334695 published in the Official Gazette for Laid-Open Patent Applications and its counterpart U.S. Pat. No. 5,689,377 as well as Japan Patent Application Disclosure No. 10-3039 and its counterpart U.S. Pat. No. 5,892,117 also use a reflecting-refracting type of optical system incorporating a concave mirror, etc., but without a beam splitter, and can also be employed with this invention. The disclosures in the above mentioned U.S. patents, as well as the Japan patent applications published in the Official Gazette for Laid-Open Patent Applications are incorporated herein by reference.

Further, in photolithography systems, when linear motors (see U.S. Pat. Nos. 5,623,853 or 5,528,118) are used in a wafer stage or a reticle stage, the linear motors can be either an air levitation type employing air bearings or a magnetic levitation type using Lorentz force or reactance force. Additionally, the stage could move along a guide, or it could be a guideless type stage which uses no guide. The disclosures in U.S. Pat. Nos. 5,623,853 and 5,528,118 are incorporated herein by reference.

Alternatively, one of the stages could be driven by a planar motor, which drives the stage by electromagnetic force generated by a magnet unit having two-dimensionally arranged magnets and an armature coil unit having two-dimensionally arranged coils in facing positions. With this type of driving system, either one of the magnet unit or the armature coil unit is connected to the stage and the other unit is mounted on the moving plane side of the stage.

Movement of the stages as described above generates reaction forces which can affect performance of the photolithography system. Reaction forces generated by the wafer (substrate) stage motion can be mechanically released to the floor (ground) by use of a frame member as described in U.S. Pat. No. 5,528,118 and published Japanese Patent Application Disclosure No. 8-166475. Additionally, reaction forces generated by the reticle (mask) stage motion can be mechanically released to the floor (ground) by use of a frame member as described in U.S. Pat. No. 5,874,820 and published Japanese Patent Application Disclosure No. 8-330224. The disclosures in U.S. Pat. Nos. 5,528,118 and 5,874,820 and Japanese Patent Application Disclosure No. 8-330224 are incorporated herein by reference.

As described above, a photolithography system according to the above described embodiments can be built by assembling various subsystems, including each element listed in the appended claims, in such a manner that prescribed mechanical accuracy, electrical accuracy and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, total adjustment is performed to make sure that every accuracy is maintained in the complete photolithography system. Additionally, it is desirable to manufacture an exposure system in a clean room where the temperature and humidity are controlled.

Figure 2:
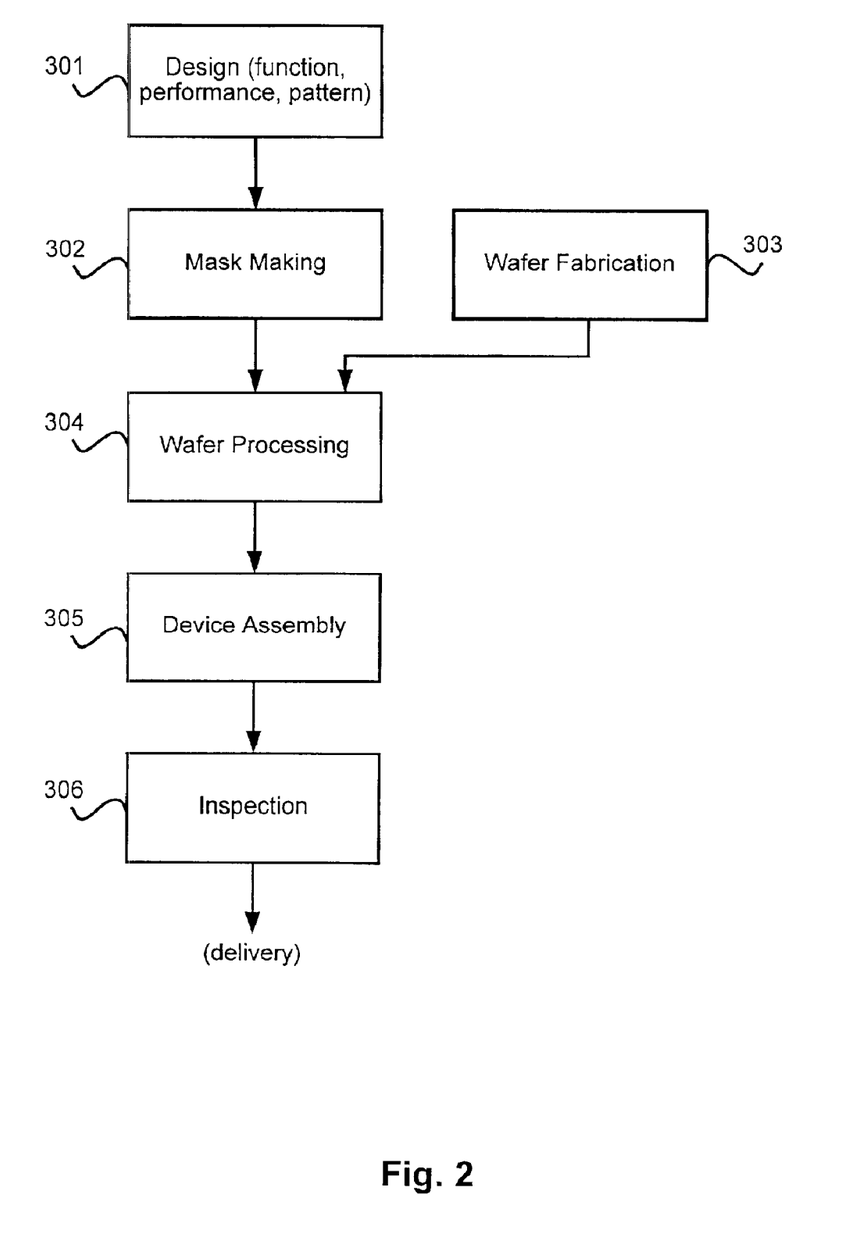
FIG. 2 is a process flow diagram illustrating an exemplary process by which semiconductor devices are fabricated using the systems shown in FIG. 1 according to the present invention.

Further, semiconductor devices can be fabricated using the above described systems, by the process shown generally in FIG. 2. In step 301 the device's function and performance characteristics are designed. Next, in step 302, a mask (reticle) having a pattern is designed according to the previous designing step, and in a parallel step 303, a wafer is made from a silicon material. The mask pattern designed in step 302 is exposed onto the wafer from step 303 in step 304 by a photolithography system such as the systems described above. In step 305 the semiconductor device is assembled (including the dicing process, bonding process and packaging process), then finally the device is inspected in step 306.

Figure 3:
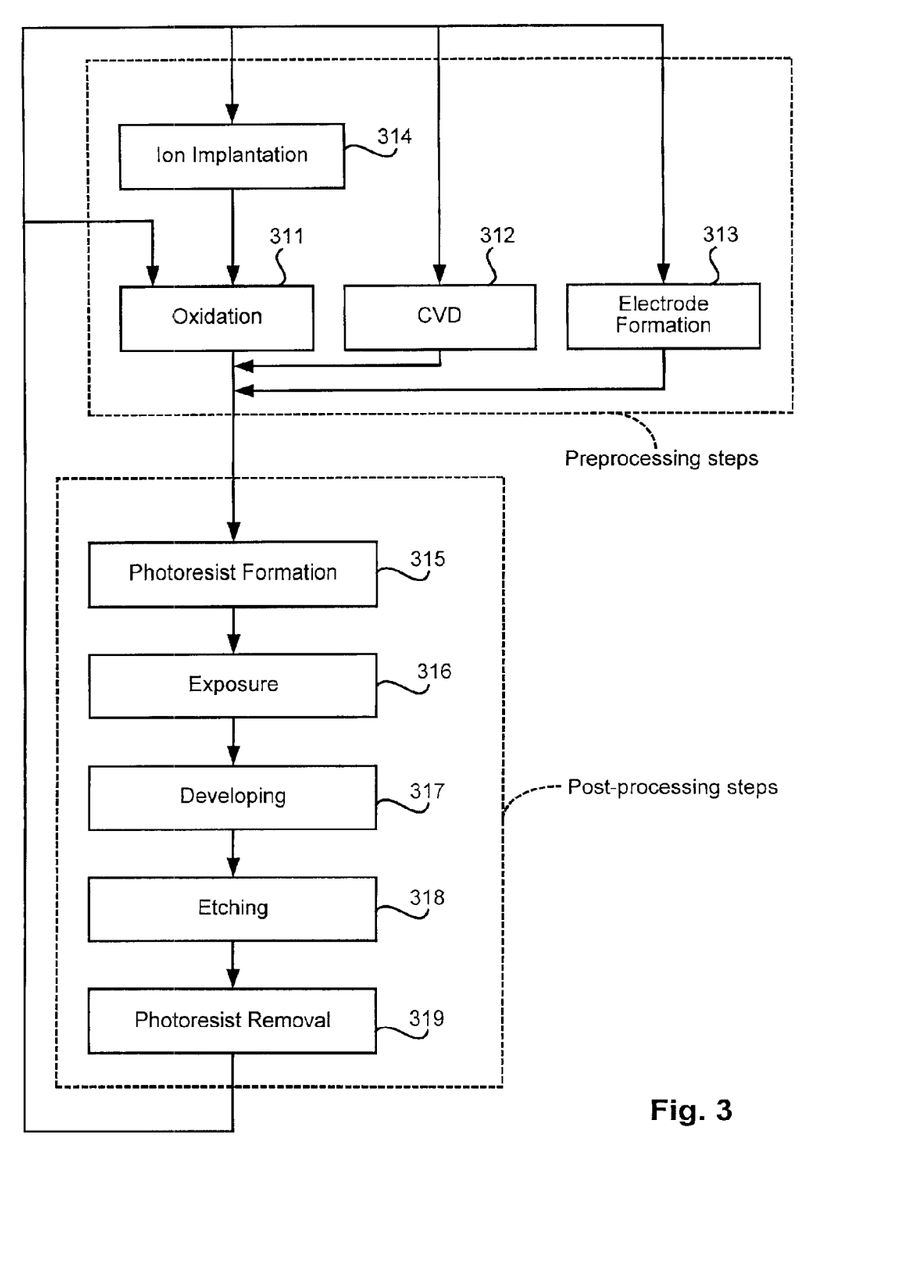
FIG. 3 is a flowchart of the wafer processing step shown in FIG. 2 in the case of fabricating semiconductor devices according to the present invention.

FIG. 3 illustrates a detailed flowchart example of the above-mentioned step 304 in the case of fabricating semiconductor devices. In step 311 (oxidation step), the wafer surface is oxidized. In step 312 (CVD step), an insulation film is formed on the wafer surface. In step 313 (electrode formation step), electrodes are formed on the wafer by vapor deposition. In step 314 (ion implantation step), ions are implanted in the wafer. The above mentioned steps 311-314 form the preprocessing steps for wafers during wafer processing, and selection is made at each step according to processing requirements.

At each stage of wafer processing, when the above-mentioned preprocessing steps have been completed, the following post-processing steps are implemented. During post-processing, initially, in step 315 (photoresist formation step), photoresist is applied to a wafer. Next, in step 316, (exposure step), the above-mentioned exposure device is used to transfer the circuit pattern of a mask (reticle) to a wafer. Then, in step 317 (developing step), the exposed wafer is developed, and in step 318 (etching step), parts other than residual photoresist (exposed material surface) are removed by etching. In step 319 (photoresist removal step), unnecessary photoresist remaining after etching is removed. Multiple circuit patterns are formed by repetition of these preprocessing and post-processing steps.

It should be appreciated that various embodiments of the present invention described referring to FIGS. 4–20 may be utilized and/or incorporated with apparatus and methods described referring to FIGS. 1–3.

Although only a few embodiments of the present invention have been described in detail, it should be understood that the present invention may be embodied in many other specific forms without departing from the spirit or scope of the invention. Therefore, it should be apparent that the above described embodiments are to be considered as illustrative and not restrictive, and the invention is not to be limited to the details given herein, but may be modified within the scope of the appended claims.

What is claimed is:

1. An apparatus for providing support between a first structure and a second structure, comprising:
    a first section having a first group of at least one magnetic frame member, the first section being coupled to the first structure; and
    a second section having a second group of at least one magnetic frame member, the second section being coupled w the second structure,
    wherein the first and second sections present magnetic force therebetween,
    wherein the second group of at least one magnetic frame member is provided within the first group of at least one magnetic frame member,
    wherein the first group of at least one magnetic frame member has a first direction of magnetic poles, the second group of at least one magnetic frame member has a second direction of magnetic poles, and the first direction is opposite to the second direction,
    wherein the first section includes a first number of at least one magnetic frame member, the second section includes a second number of at least one magnetic frame member, and a difference between the first number and the second number is no more than 1, and
    wherein the first number is more than 1, the second number is more than 1, a first pitch of the magnetic frame members included in the first group is smaller than a second pitch of the magnetic frame members included in the second group.

2. The apparatus of claim 1, wherein a ratio of the second pitch to the first pitch is more than 1 and less than 1.5.

3. An apparatus for providing support between a first structure and a second structure, comprising:
    a first section having a first group of at least one magnetic frame member, the first section being coupled to the first structure; and
    a second section having a second group of at least one magnetic frame member, the second section being coupled to the second structure,
    wherein the first and second sections present magnetic force therebetween,
    wherein the second group of at least one magnetic frame member is provided within the first group of at least one magnetic frame member,
    wherein the first group of at least one magnetic frame member has a first direction of magnetic poles, the second group of at least one magnetic frame member has a second direction of magnetic poles, and the first direction is opposite to the second direction,
    wherein the first section baa a third group of at least one magnetic core, and
    wherein the third group of at least one magnetic core is provided within the second group of at least one magnetic frame member.

4. The apparatus of claim 3, wherein the third group of at least one magnetic core has a third direction of magnetic poles, and the third direction is the same as the first direction.

5. The apparatus of claim 4, wherein the first section includes a third number of at least one magnetic core, and the third number is the same as the first number.

6. The apparatus of claim 5, wherein the third number is more than 1, a third pitch of the magnetic frame members included in the third group is smaller than a second pitch of the magnetic frame members included in the second group.

7. The apparatus of claim 6, wherein a ratio of the second pitch to the third pitch is more than 1 and less than 1.5.

8. The apparatus of claim 7, wherein the first, second and third numbers are 4, 3 and 4, respectively.

9. A method of providing support between a first structure and a second structure, comprising:
    coupling a first section to the first structure, the first section having a first group of at least one magnetic frame member; and
    coupling a second section to the second structure, the second section having a second group of at least one magnetic frame member,
    wherein the first and second sections present magnetic force therebetween,
    wherein the second group of at least one magnetic frame member is provided within the first group of at least one magnetic frame member,
    wherein the first group of at least one magnetic frame member has a first direction of magnetic poles, the second group of at least one magnetic frame member has a second direction of magnetic poles, and the first direction is opposite to the second direction,
    wherein the first section includes a first number of at least one magnetic frame member, the second section includes a second number of at least one magnetic frame member, and a difference between the first number and the second number is no more than 1, and
    wherein the first number is more than 1, the second number is more than 1, a first pitch of the magnetic frame members included in the first group is smaller than a second pitch of the magnetic frame members included in the second group.

10. The method of claim 9, wherein a ratio of the second pitch to the first pitch is more than 1 and less than 1.5.

11. A method of providing support between a first structure and a second structure, comprising:
    coupling a first section to the first structure the first section having a first group of at least one magnetic frame member; and
    coupling a second section to the second structure, the second section having a second group of at least one magnetic frame member,
    wherein the first and second sections present magnetic force therebetween,
    wherein the second group of at least one magnetic frame member is provided within the first group of at least one magnetic frame member,
    wherein the first group of at least one magnetic frame member has a first direction of magnetic poles, the second group of at least one magnetic frame member has a second direction of magnetic poles, and the first direction is opposite to the second direction,
    wherein the first section has a third group of at least one magnetic core, and wherein the third group of at least one magnetic core is provided within the second group of at least one magnetic frame member, wherein the third group of at least one magnetic.

12. The method of claim 11, wherein the third group of at least one magnetic core has a third direction of magnetic poles, and the third direction is the same as the first direction.

13. The method of claim 12, wherein the first section includes a third number of at least one magnetic core, and the third number is the same as the first number.

14. The method of claim 13, wherein the third number is more than 1, a third pitch of the magnetic frame members included in the third group is smaller than a second pitch of the magnetic frame members included in the second group.

15. The method of claim 14, wherein a ratio of the second pitch to the third pitch is more than 1 and less than 1.5.

16. The method of claim 15, wherein the first, second and third numbers are 4, 3 and 4, respectively.

17. A method for making an object using a lithography process, wherein the lithography process utilizes a method of providing support between a first structure and a second structure, the method including coupling a first section to the first structure, the first section having a first group of at least one magnetic frame member; and coupling a second section to the second structure, the second section having a second group of at least one magnetic frame member, wherein the first and second sections present magnetic force therebetween.

18. A method for patterning a wafer using a lithography process, wherein the lithography process utilizes a method of providing support between a first structure and a second structure, the method including coupling a first section to the first structure, the first section having a first group of at least one magnetic frame member; and coupling a second section to the second structure, the second section having a second group of at least one magnetic frame member; wherein the first and second sections present magnetic force therebetween.

19. An apparatus that supports a first structure relative to a second structure, comprising:

a first member that includes a first magnetic member having a magnetic pole; and a second member that includes a cylindrical shell having a magnetic member;

wherein the direction of the magnetic pole of the first magnetic member is substantially parallel to a support direction of die first structure, wherein a cross section of the first member cut by a plane perpendicular to the support direction has a circular outer periphery, wherein the cylindrical shell surrounds at least an outer surface of a part of the first member, wherein the first member and the second member present magnetic force therebetween, and wherein one of the first member and the second member is connected to the first structure, and the other of the first member and the second member is connected to the second structure.

20. The apparatus of claim 19, wherein a shape of the first member is column.

21. The apparatus of claim 20, wherein the direction of the magnetic pole of the second magnetic member is substantially parallel to a support direction of the first structure.

22. The apparatus of claim 19, wherein the cylindrical shell includes a second magnetic member that has a magnetic pole.

23. The apparatus of claim 19, further comprising:

a third member that includes a second cylindrical shell having a magnetic member, wherein the second cylindrical shell surrounds at least an outer surface of a part of the second member, wherein the third member being coupled to the one of the first and second structures to which the first member is connected, and wherein the second member and the third member present magnetic force therebetween.

24. A method of providing support between a first structure and a second structure, comprising:

connecting a first member to the first structure; and connecting a second member to the second structure, wherein the first member includes a first magnetic member that has a magnetic pole, wherein the direction of the magnetic pole of the first magnetic member is substantially parallel to a support direction of the first structure, wherein a cross section of the first member cut by a plane perpendicular to the support direction has a circular outer periphery, wherein the second member includes a cylindrical shell that has a magnetic member, wherein the cylindrical shell surrounds at least an outer surface of a part of the first member, and wherein the first member and the second member present magnetic force therebetween.

25. The method of claim 24, wherein a shape of the first member is column.

26. The method of claim 24, wherein the cylindrical shell comprises a second magnetic member that has a magnetic pole.

27. The method of claim 24, wherein the direction of the magnetic pole of the second magnetic member is substantially parallel to a support direction of the first structure.

28. The method of claim 24, further comprising:

connecting a third member to the one of the first and second structures to which the first member is connected, wherein the third member includes a second cylindrical shell that has a magnetic member, wherein the second cylindrical shell surrounds at least an outer surface of a part of the second member; and wherein the second member and the third member present magnetic force therebetween.

* * * * *

UNITED STATES PATENT AND TRADEMARK OFFICE
CERTIFICATE OF CORRECTION

PATENT NO.   : 6,879,127 B2
DATED        : April 12, 2005
INVENTOR(S)  : Jean-Marc Gery

It is certified that error appears in the above-identified patent and that said Letters Patent is hereby corrected as shown below:

Column 9,
Line 21, change "coupled w" to -- coupled to --.
Line 63, change "baa a third" to -- has a third --.

Column 11,
Line 4, delete ", wherein the third group of at least one magnetic".
Line 54, change "of die first" to -- of the first --.

Signed and Sealed this

Nineteenth Day of July, 2005

JON W. DUDAS
*Director of the United States Patent and Trademark Office*